United States Patent
Winkler et al.

(10) Patent No.: US 11,803,217 B2
(45) Date of Patent: Oct. 31, 2023

(54) MANAGEMENT OF COMPOSITE COLD TEMPERATURE FOR DATA STORAGE DEVICES

(71) Applicant: Western Digital Technologies, Inc., San Jose, CA (US)

(72) Inventors: Bret Dee Winkler, Mission Viejo, CA (US); Mark James Hardiman, Los Altos, CA (US); Jeff Furlong, Irvine, CA (US); Christian Khanh Phan, Cypress, CA (US); Jeffrey James Levie, Gilbert, AZ (US); David Allen Wright, San Tan Valley, AZ (US)

(73) Assignee: Western Digital Technologies, Inc., San Jose, CA (US)

( * ) Notice: Subject to any disclaimer, the term of this patent is extended or adjusted under 35 U.S.C. 154(b) by 38 days.

(21) Appl. No.: 17/543,463

(22) Filed: Dec. 6, 2021

(65) Prior Publication Data
US 2023/0176634 A1 Jun. 8, 2023

(51) Int. Cl.
G05D 23/00 (2006.01)
G06F 1/20 (2006.01)
G11C 5/14 (2006.01)
G06F 11/30 (2006.01)

(52) U.S. Cl.
CPC .......... *G06F 1/206* (2013.01); *G06F 11/3034* (2013.01); *G06F 11/3058* (2013.01); *G11C 5/14* (2013.01)

(58) Field of Classification Search
CPC .. G06F 1/206; G06F 11/3034; G06F 11/3058; G11C 5/14
See application file for complete search history.

(56) References Cited

U.S. PATENT DOCUMENTS

| | | | |
|---|---|---|---|
| 9,405,356 B1 | 8/2016 | Sareen et al. | |
| 9,672,934 B2 | 6/2017 | Liang et al. | |
| 10,222,843 B1* | 3/2019 | Lin | H05K 7/20209 |
| 10,990,497 B2 | 4/2021 | Pao | |
| 2007/0067136 A1* | 3/2007 | Conroy | G06F 1/206 |
| | | | 713/300 |
| 2011/0278937 A1* | 11/2011 | Patino | H05K 7/20945 |
| | | | 307/80 |
| 2019/0155348 A1* | 5/2019 | Lu | G06F 1/206 |
| 2020/0379525 A1 | 12/2020 | Luo et al. | |
| 2021/0019245 A1* | 1/2021 | Tsai | G06F 11/3692 |

* cited by examiner

*Primary Examiner* — Zhipeng Wang
(74) *Attorney, Agent, or Firm* — LOZA & LOZA, LLP; Gabriel Fitch

(57) ABSTRACT

Methods and apparatus for thermal management in data storage devices are provided. One such data storage device includes a non-volatile memory (NVM), at least one ambient temperature sensor configured to detect an ambient temperature of the data storage device, at least one component temperature sensor configured to detect one or more component temperatures of one or more components of the data storage device, and a processor coupled to the NVM, the at least one ambient temperature sensor, and the at least one component temperature sensor. The processor is configured to determine a composite temperature of the data storage device based on the one or more component temperatures and the ambient temperature. The processor is further configured to determine whether the composite temperature exceeds a threshold and perform a thermal management operation if the composite temperature exceeds the threshold.

21 Claims, 8 Drawing Sheets

MANAGEMENT OF COMPOSITE COLD TEMPERATURE FOR DATA STORAGE DEVICES

FIELD

The subject matter described herein relates to data storage devices and controllers. More particularly, the subject matter relates, in some examples, to the management of composite cold temperature for data storage devices.

Introduction

Data storage devices, such as solid-state devices (SSDs), may generate a significant amount of heat during operation. In the case of SSDs, for example, a controller of an SSD may be instructed (e.g., by a host device) to execute a series of memory operations (e.g., read, write, etc.) with respect to one or more non-volatile memory devices (e.g., NAND Flash memory devices). Rapid execution of these memory operations to meet the performance demands of the host may cause excess heat to build up in the SSD. Such excess heat may raise the temperature of the SSD to a critical temperature (e.g., a temperature at which the SSD shuts off to prevent damage to the components of the SSD), thereby negatively impacting SSD performance.

A composite temperature of an SSD may be used to prevent damage to the SSD from overheating. The composite temperature is a temperature indicating the SSD's internal temperature as algorithmically determined by reading multiple temperature sensors placed at various locations within the SSD. A core firmware (FW) may be responsible for polling all temperature sensors and calculating the composite temperature periodically. A formula for determining the composite temperature may be defined to meet various manufacturing and/or customer requirements, including thermal throttling, warning composite temperature threshold (WCTEMP), critical composite temperature threshold (CCTEMP), thermal shutdown, and thermal reliability. The composite temperature may facilitate real-time decisions made by the SSD (e.g., the SSD may trigger thermal shutdown at a composite temperature of X° C.). Accordingly, the method in which the composite temperature is determined may be helpful for ensuring all components of the SSD are protected by thermal protection mechanisms.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One aspect of the disclosure provides a data storage device, comprising a non-volatile memory (NVM), at least one ambient temperature sensor configured to detect an ambient temperature of the data storage device, at least one component temperature sensor configured to detect one or more component temperatures of one or more components of the data storage device, and a processor coupled to the NVM, the at least one ambient temperature sensor, and the at least one component temperature sensor. The processor is configured to determine a composite temperature of the data storage device based on the one or more component temperatures and the ambient temperature, determine whether the composite temperature exceeds a threshold, and perform a thermal management operation if the composite temperature exceeds the threshold.

One aspect of the disclosure provides a method for use with a data storage device including a non-volatile memory (NVM). The method includes detecting an ambient temperature of the data storage device, detecting one or more component temperatures of one or more components of the data storage device, determining a composite temperature of the data storage device based on the one or more component temperatures and the ambient temperature, determining whether the composite temperature exceeds a threshold, and performing a thermal management operation if the composite temperature exceeds the threshold.

One aspect of the disclosure provides a data storage device comprising a non-volatile memory (NVM), means for detecting an ambient temperature of the data storage device, means for detecting one or more component temperatures of one or more components of the data storage device; means for determining a composite temperature of the data storage device based on the one or more component temperatures and the ambient temperature, means for determining whether the composite temperature exceeds a threshold, and means for performing a thermal management operation if the composite temperature exceeds the threshold.

DETAILED DESCRIPTION

Figure 1:
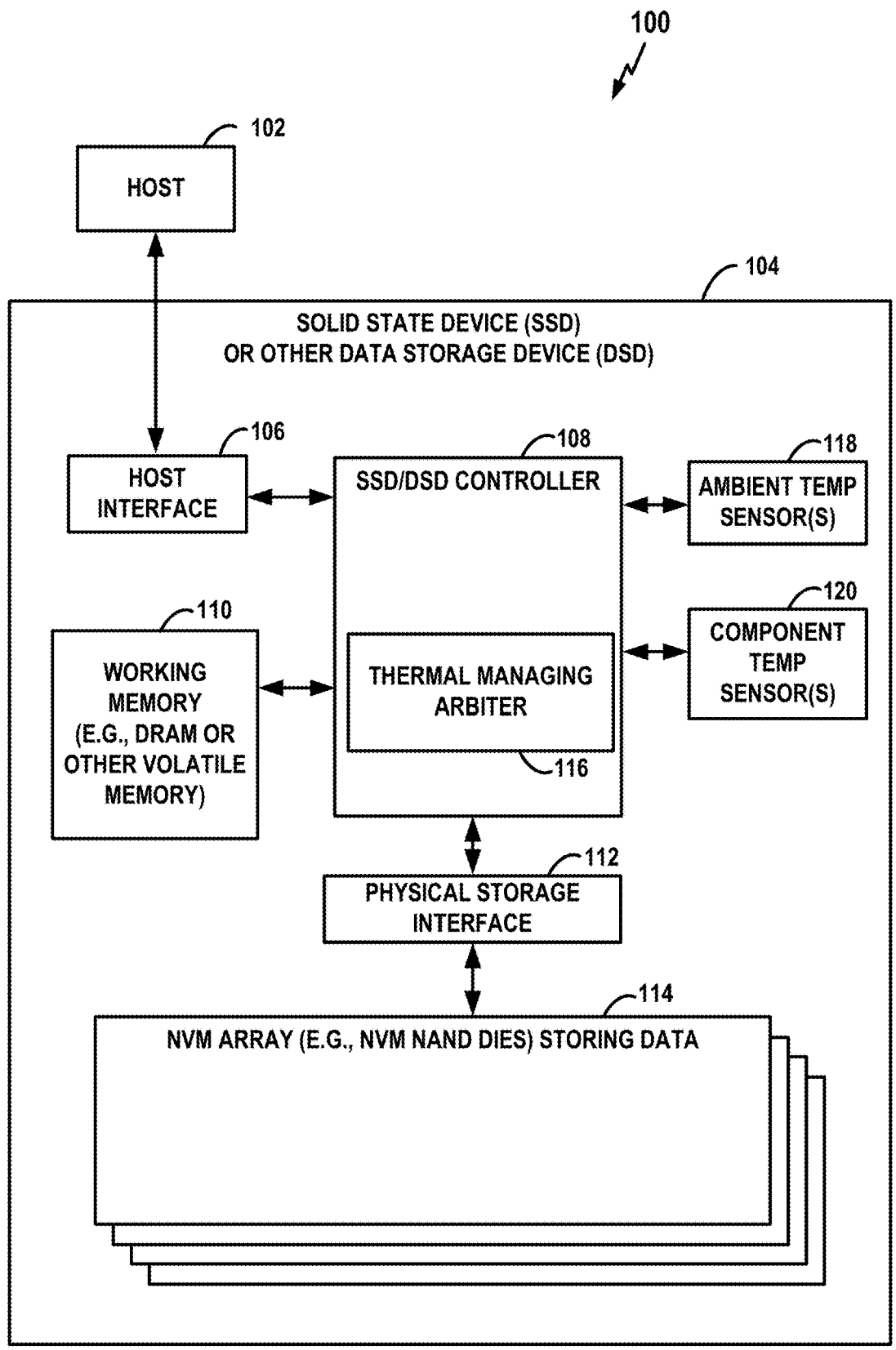
FIG. 1 is a schematic block diagram illustrating an exemplary data storage device (DSD) embodied as a solid-state device (SSD) including one or more ambient temperature sensors, one or more component temperature sensors, and an SSD controller configured to control thermal management operations in accordance with some aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to data storage devices (DSDs) and to data storage controllers of the DSDs. In the main examples described herein, data is stored within non-volatile memory (NVM) arrays. In other examples, data may be stored in hard disk drives (HDD). DSDs with NVM arrays may be referred to as solid state devices (SSDs). Some SSDs use NAND flash memory, herein referred to as "NANDs." A NAND is a type of non-volatile storage technology that does not require power to retain data. It exploits negative-AND, i.e., NAND, logic. For the sake of brevity, an SSD having one or more NAND dies will be used as a non-limiting example of a DSD below in the description of various embodiments. It is understood that at least some aspects described herein may be applicable to other forms of DSDs as well. For example, at least some aspects described herein may be applicable to phase-change memory (PCM) arrays, magneto-resistive random access memory (MRAM) arrays, and resistive random access memory (ReRAM) arrays.

Overview

Typical techniques for determining the composite temperature largely ignore a cold end of the temperature spectrum. As such, the composite temperature may not correspond to SSD components having the coldest temperatures. Failures at cold temperatures may be driven by the coldest components. An issue that may arise from not managing the cold end of the composite temperature spectrum is that an ambient temperature around the SSD may be significantly lower than the composite temperature of the SSD (e.g., lower by −15° C. or more). This may cause a problem during test and validation of the SSD, or even cause damage to the SSD, since the SSD is typically tested or cycled down to 0° C. (or slightly lower) composite temperature. Because many components on the SSD are only specified down to 0° C. ambient temperature, driving the components to −15° C. or below ambient temperature may lead to testing/validating the SSD with components that are out of specification and increase the likelihood of a consumer experiencing issues (e.g., data loss, inability to transfer data, etc.) when running the SSD at 0° C. composite temperature. Accordingly, improved techniques for managing cold composite temperature for SSDs are needed.

Aspects of the disclosure relate to improved techniques for thermal management of a data storage device. One particular aspect involves a data storage device such as an SSD that includes a non-volatile memory (NVM), at least one ambient temperature sensor configured to detect an ambient temperature of the data storage device, at least one component temperature sensor configured to detect one or more component temperatures of one or more components of the data storage device, and a controller or processor coupled to the NVM, the at least one ambient temperature sensor, and the at least one component temperature sensor. In such case, the processor is configured to determine a composite temperature of the data storage device based on the one or more component temperatures and the ambient temperature. In one aspect, the processor is also configured to determine whether the composite temperature exceeds a threshold and perform a thermal management operation if the composite temperature exceeds the threshold.

Several advantages are provided by these improved techniques for thermal management. For example, for a data storage device that is typically tested or cycled down to no lower than 0° C. composite temperature (e.g., device components are only specified down to 0° C. composite temperature), a composite temperature formulation is provided that considers a cold end of the temperature spectrum (e.g., ambient temperature) in order to test/validate the data storage device at cold temperatures while the device components are within safe operating conditions (e.g., no lower than 0° C. ambient temperature). This prevents damage to the device components and lessens the likelihood of a consumer experiencing issues (e.g., data loss, inability to transfer data, etc.) when running the data storage device at 0° C. composite temperature. This also leads to a higher yield of SSDs in testing/validation due to use of a more accurate composite temperature.

Exemplary Devices, Systems and Procedures

FIG. 1 is a schematic block diagram illustrating an exemplary data storage device (DSD) embodied as a solid-state device (SSD) including one or more ambient temperature sensors, one or more component temperature sensors, and an SSD controller configured to control thermal management operations in accordance with some aspects of the disclosure. The system 100 includes a host 102 and the SSD 104 (or other DSD, but for simplicity referred to as an SSD below) coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may be a computing device, a personal computer, a portable computer, a workstation, a server, a personal digital assistant, a digital camera, or a digital phone as merely a few examples.

The SSD 104 includes a host interface 106, an SSD or DSD controller 108, a working memory 110 (such as DRAM or other volatile memory), a physical storage (PS) interface 112 (e.g., flash interface module (FIM)), and an NVM array 114 having one or more dies storing data. The host interface 106 is coupled to the controller 108 and facilitates communication between the host 102 and the controller 108. The controller 108 is coupled to the working memory 110 as well as to the NVM array 114 via the PS interface 112. The host interface 106 may be any suitable communication interface, such as a Non-Volatile Memory express (NVMe) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link. The NVM array 114 may include multiple dies.

In some examples, the host 102 may be a laptop computer with an internal SSD and a user of the laptop may wish to playback video stored by the SSD. In another example, the host again may be a laptop computer, but the video is stored by a remote server.

Although, in the example illustrated in FIG. 1, SSD 104 includes a single channel between controller 108 and NVM array 114 via physical storage (PS) interface 112, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The controller 108 may be implemented in a single integrated circuit chip and may communicate with different layers of memory in the NVM 114 over one or more command channels.

The controller 108 controls operation of the SSD 104. In various aspects, the controller 108 receives commands from the host 102 through the host interface 106 and performs the commands to transfer data between the host 102 and the NVM array 114. Furthermore, the controller 108 may manage reading from and writing to working memory 110 for performing the various functions effected by the controller and to maintain and manage cached information stored in the working memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, application specific integrated circuit (ASIC), or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements. The SSD controller 108 includes a thermal managing arbiter 116, which can be configured to perform thermal management as will be described in further detail below. In one aspect, the thermal managing arbiter 116 can determine a composite temperature of the SSD 104 based on an ambient temperature detected by one or more ambient temperature sensors 118 and one or more component temperatures detected by one or more component temperature sensors 120. In one aspect, the thermal managing arbiter 116 is a module within the SSD controller 108 that is controlled by firmware. In one aspect, the thermal throttling arbiter/controller 116 may be a separate component from the SSD controller 108 and may be implemented using any combination of hardware, software, and firmware (e.g., like the implementation options described above for SSD controller 108) that can perform thermal management as will be described in further detail below. In one example, the thermal managing arbiter 116 is implemented using a firmware algorithm or other set of instructions that can be performed on the SSD controller 108 to implement the thermal management functions described below.

The working memory 110 may be any suitable memory, computing device, or system capable of storing data. For example, working memory 110 may be ordinary RAM, DRAM, double data rate (DDR) RAM, static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the working memory 110, or a portion thereof, to store data during the transfer of data between the host 102 and the NVM array 114. For example, the working memory 110 or a portion of the volatile memory 110 may be a cache memory. The NVM array 114 receives data from the controller 108 via the PS interface 112 and stores the data. In some embodiments, working memory 110 may be replaced by a non-volatile memory such as MRAM, PCM, ReRAM, etc. to serve as a working memory for the overall device.

The NVM array 114 may be implemented using NAND flash memory. In one aspect, the NVM array 114 may be implemented using any combination of NAND flash, PCM arrays, MRAM arrays, and/or ReRAM.

The PS interface 112 provides an interface to the NVM array 114. For example, in the case where the NVM array 114 is implemented using NAND flash memory, the PS interface 112 may be a flash interface module. In one aspect, the PS interface 112 may be implemented as a component of the SSD controller 108.

In the example of FIG. 1, the controller 108 may include hardware, firmware, software, or any combinations thereof that provide the functionality for the thermal management arbiter 116.

Although FIG. 1 shows an exemplary SSD and an SSD is generally used as an illustrative example in the description throughout, the various disclosed embodiments are not necessarily limited to an SSD application/implementation. As an example, the disclosed NVM array and associated processing components can be implemented as part of a package that includes other processing circuitry and/or components. For example, a processor may include, or otherwise be coupled with, embedded NVM array and associated circuitry. The processor could, as one example, off-load certain operations to the NVM and associated circuitry and/or components. As another example, the SSD controller 108 may be a controller in another type of device and still be configured to perform or control thermal shutdown management and/or throttling, and perform some or all of the other functions described herein.

Composite Temperature

In general, a composite temperature is an overall temperature of an SSD used to prevent damage to SSD components due to overheating. For example, the composite temperature may be used to warn of potential component damage and trigger/perform thermal protection mechanisms at the SSD, such as throttling and/or shutdown. The composite temperature may be visible to a host so that various thermal management actions (e.g., thermal protection mechanisms) performed by the SSD may occur at predictable and host-visible thresholds. In an aspect, the composite temperature is algorithmically determined by reading multiple temperature sensors placed at various locations within the SSD. That is, various temperature sensor readings may be combined in a function to generate the composite temperature. A temperature sensor may be located on a circuit board, within an integrated circuit (IC) of interest (e.g., the IC for which the temperature is monitored/measured), adjacent to the IC of interest, etc. For example, a temperature sensor may be located within an ASIC (e.g., SSD controller) or NAND. In another example, an external temperature sensor may be placed on the circuit board next to a NAND of interest (e.g., hottest NAND) under all conditions.

The composite temperature may be higher or lower than an actual reading of any individual sensor (for various components on the circuit board). Ideally, the composite temperature is within a range such that the components on the circuit board do not overheat, i.e., the components on the circuit board are not stressed due to heat. Moreover, the composite temperature may be recorded in various drive logs and reported through a NVMe Self-Monitoring Analysis and Reporting Technology (SMART) log and a System Management Bus (SMBus).

Figure 2:
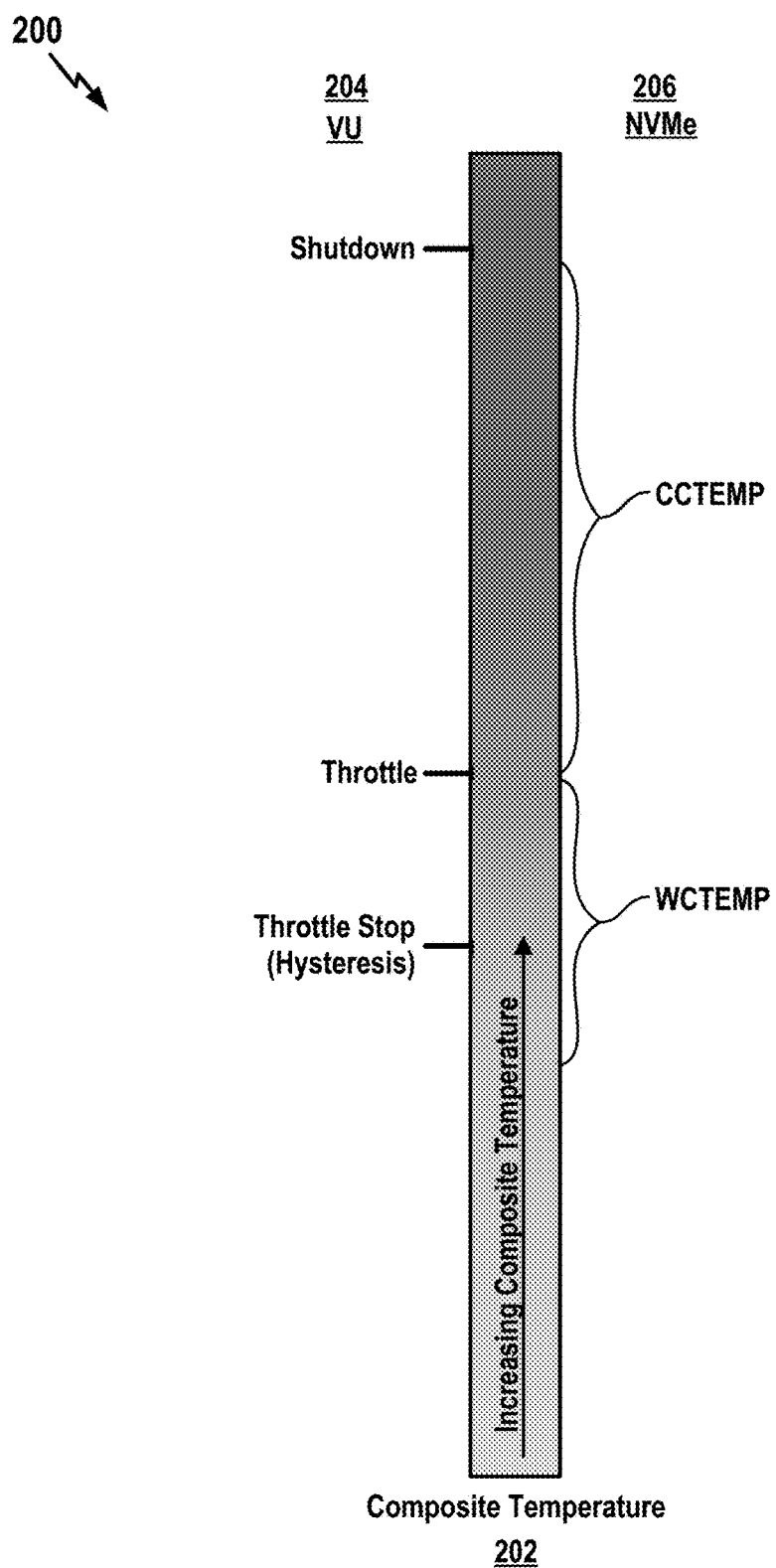
FIG. 2 is a diagram 200 illustrating a composite temperature triggering multiple drive (e.g., SSD) behaviors in accordance with some aspects of the disclosure.

FIG. 2 is a diagram 200 illustrating a composite temperature 202 triggering multiple drive (e.g., SSD) behaviors. A left column 204 shows composite temperature thresholds that may be vendor unique (VU). That is, the thermal throttling/shutdown behaviors of the left column 204 may be governed by a vendor's requirements and are not necessarily built into a Non-Volatile Memory express (NVMe) SSD, excluding host controlled thermal management (HCTM). As shown, the VU thresholds may include a throttle stop composite temperature threshold, a throttle composite temperature threshold, and a shutdown composite temperature threshold. A right column 206 shows other thresholds that are built into NVMe, including a warning composite temperature threshold (WCTEMP), which triggers a SMART critical warning, and a critical composite temperature threshold (CCTEMP). A precise relationship between the VU and NVMe thresholds may be customer and/or product specific, however, the general ranges of WCTEMP/CCTEMP relative to the VU thresholds are shown in FIG. 2.

In an example implementation, the composite temperature for a circuit board may be within a range of 0 to 70° C. Moreover, a component (e.g., ASIC such as the SSD controller) of the circuit board may have a shutdown temperature threshold of 85° C. Accordingly, when the component approaches 83° to 84° C., the SSD may report a composite temperature of 70° C. (e.g., to the host) and perform corresponding thermal management actions (e.g., throttle, shutdown, etc.) to prevent the component from overheating. Although other components on the circuit board may have temperatures lower than the composite temperature (e.g., 50° C.), the SSD will focus on protecting whichever component is approaching its shutdown temperature limit. Accordingly, a maximum limit for triggering the reporting of the composite temperature (and corresponding thermal management actions) may be the temperature limit of the hottest component on the circuit board given the workload, environment, etc. The hottest component may be any one of a number of different components on the circuit board.

Figure 3:
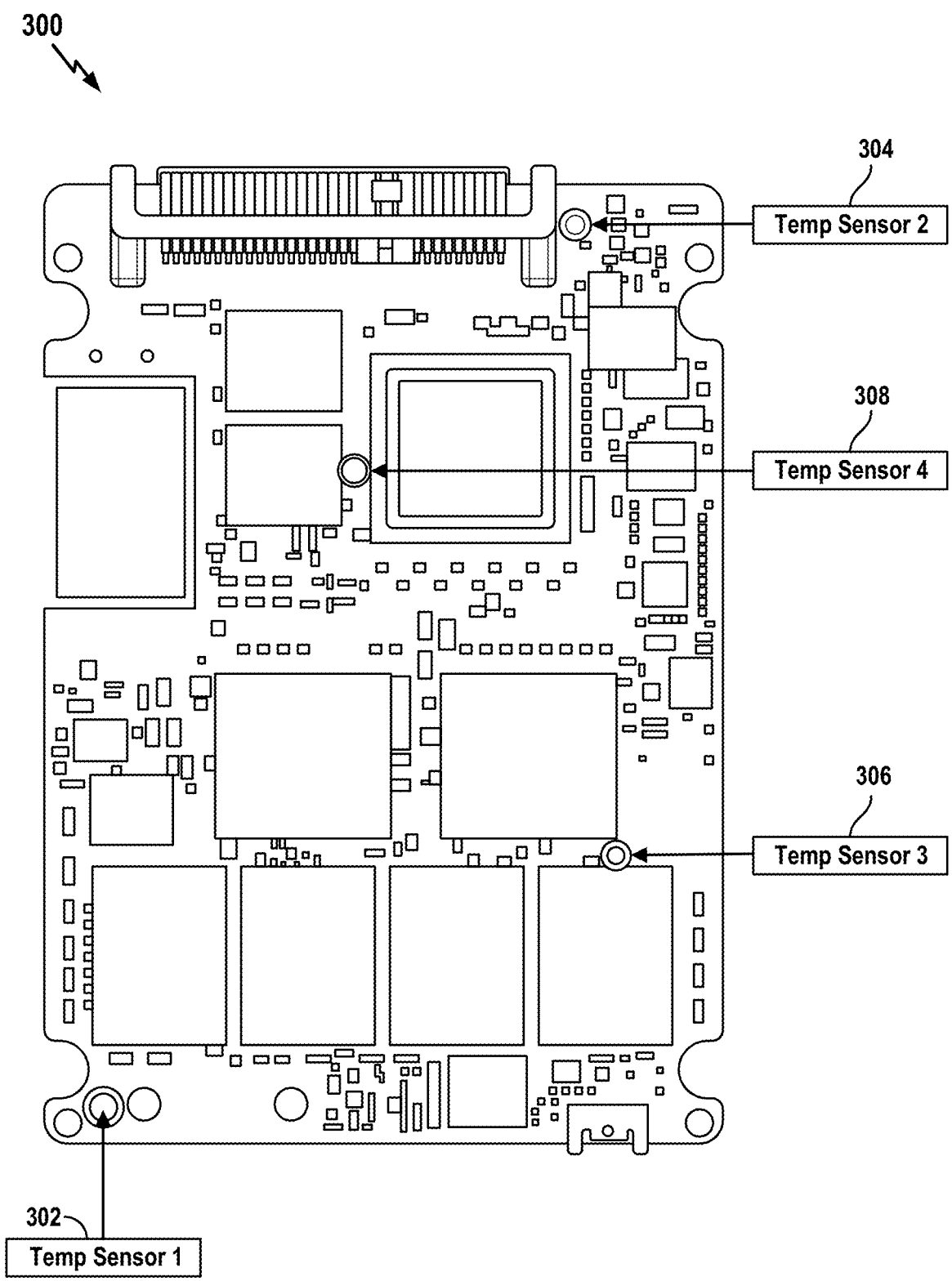
FIG. 3 is a schematic diagram illustrating an exemplary SSD implemented on a printed circuit board (PCB) having temperature sensors placed at various locations in accordance with some aspects of the disclosure.

FIG. 3 is a schematic diagram illustrating an exemplary SSD implemented on a printed circuit board (PCB) 300 having temperature sensors placed at various locations in accordance with some aspects of the disclosure. In an aspect, a temperature sensor is capable of monitoring the temperature of various device components, such as a NAND, a DRAM, a Front End ASIC (FE), or a Flash Manager ASIC (FM), for example. In an example implementation, a first temperature sensor 302 (Temp sensor 1) may be a first ambient temperature sensor located at a drive inlet and configured to monitor a drive inlet air temperature. A second temperature sensor 304 (Temp sensor 2) may be a second ambient temperature sensor located at a drive outlet and configured to monitor a drive outlet air temperature. A third temperature sensor 306 (Temp sensor 3) may be located between an FM and a hottest NAND and configured to monitor a hottest NAND temperature. A fourth temperature sensor 308 (Temp sensor 4) may be located between an FE and a hottest DDR RAM and configured to monitor a hottest DDR RAM temperature.

In an aspect, the temperature of a component of interest may be determined by the temperature of a sensor located near the component and an offset associated with the sensor. For example, the offset may be determined by placing a temperature sensor on the circuit board near the component to measure the temperature of the circuit board and placing a thermocouple directly on the component to measure an actual temperature of the component. Thereafter, various tests may be performed to compare a temperature reading of the sensor on the circuit board near the component to a temperature reading of the thermocouple directly on the component. As a result, if the sensor reading on the circuit board is a certain temperature (e.g., 60° C.) and the reading of the thermocouple on the component is a different temperature (e.g., 65° C.), then the offset associated with the sensor may be determined by calculating a difference between the two readings (e.g., 65° C.-60° C.=5° C.). Thereafter, the temperature of the component of interest may be calculated by obtaining the sensor temperature on the circuit board near the component (e.g., 60° C.) and adding the offset (e.g., 5° C.).

In an aspect, after the temperatures of various device components are determined (e.g., via the various temperature sensors), one or more equations may be used to determine the composite temperature based on the determined component temperatures.

Figure 4:
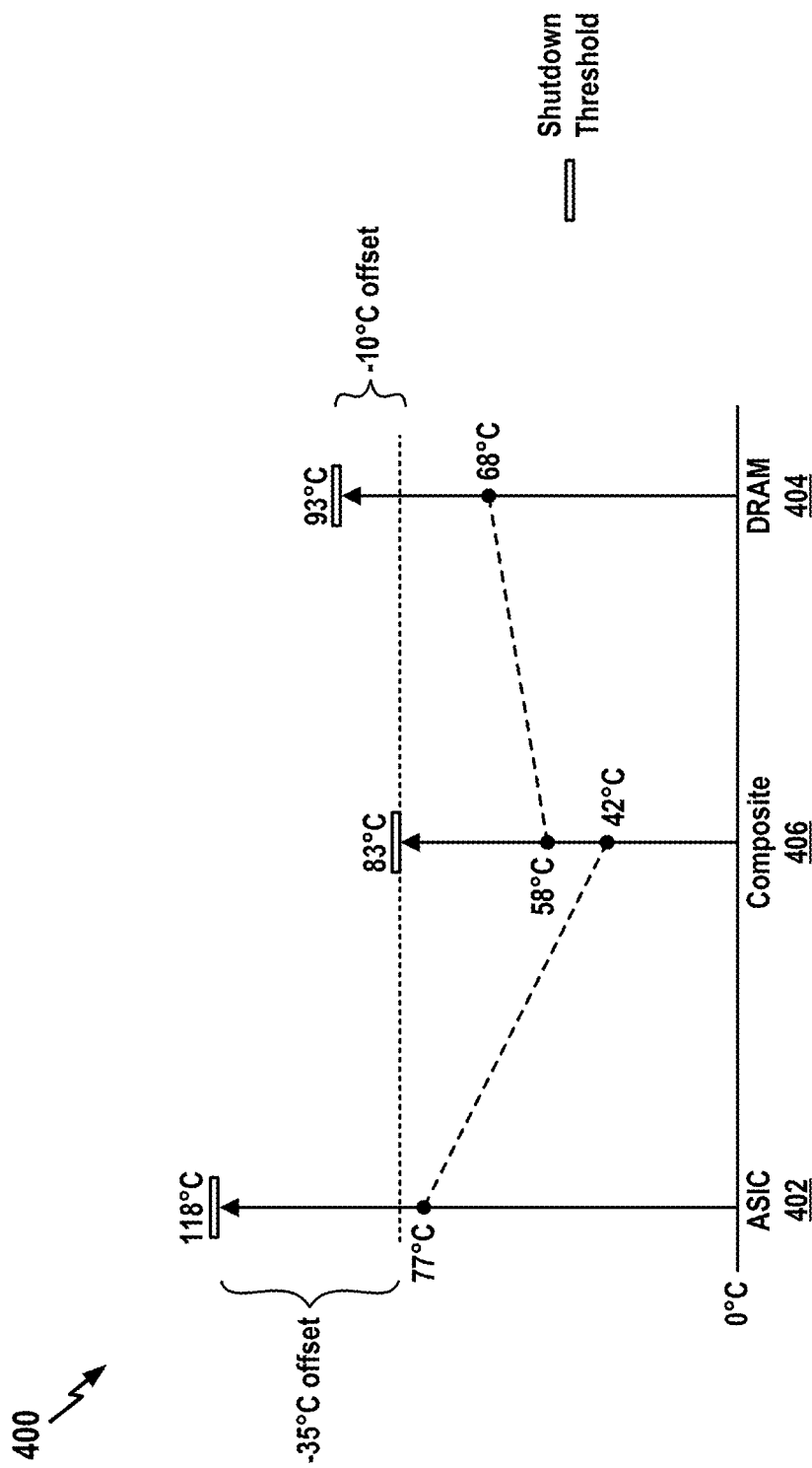
FIG. 4 is a diagram illustrating a visualization of an example composite temperature protecting device components (e.g., ASIC and DRAM) at hot temperatures in accordance with some aspects of the disclosure.

FIG. 4 is a diagram 400 illustrating a visualization of an example composite temperature protecting device components (e.g., ASIC and DRAM) at hot temperatures. In an aspect, the composite temperature may be derived from the device component with the least amount of remaining headroom (temperature headroom) before shutdown. Headroom may be calculated per component based on equation (1) below:

$$\text{Headroom} = (\text{Component shutdown threshold}) - (\text{Current overall temperature}). \quad (1)$$

In the example shown in FIG. 4, a first component (ASIC) 402 may have a shutdown threshold temperature of 118° C. If the current overall/composite temperature is 83° C., then the ASIC 402 has a headroom of 35° C. (118° C.-83° C.=35° C.). In an aspect, the ASIC 402 may be an SSD controller. However, in other aspects, the ASIC 402 may be any chip component in the SSD with a tendency to become relatively hot or sufficiently hot so as to be near its component shutdown temperature. A second component (DRAM) 404 may have a shutdown threshold temperature of 93° C. Based on the current overall temperature being 83° C., the DRAM 404 has a headroom of 10° C. (93° C.-83° C.=10° C.).

The headroom value of a component may be applied as an offset to a temperature of the component to align with a throttling threshold. As an example, and as shown in FIG. 4, the ASIC 402 may have a temperature of 77° C. and the DRAM 404 may have a temperature of 68° C. Accordingly, for the ASIC 402, an offset of 35° C. (headroom of ASIC 402) may be applied to the temperature of 77° C. Thus, an adjusted temperature of the ASIC 402 is 42° C. (77° C.-35° C.=42° C.). For the DRAM 404, an offset of 10° C. may be applied to the temperature of 68° C. Thus, an adjusted temperature of the DRAM 404 is 58° C. (68° C.-10° C.=58° C.).

In an aspect, the composite temperature may be equal to a highest temperature value among all adjusted temperatures determined for all monitored device components in the SSD.

This may be referred to as a composite$_{hot}$ temperature formulation. Using the example of FIG. 4, the composite temperature for hot temperatures may be determined based on equation (2) below:

$$\text{Composite}_{hot}=\max[(\text{ASIC temperature}-\text{ASIC offset}), (\text{DRAM temperature}-\text{DRAM offset})]. \quad (2)$$

In FIG. 4, composite$_{hot}$=max[(77° C.-35° C.), (68° C.-10° C.)]=max[42° C., 58° C.]=58° C. Hence, based on the examples used in FIG. 4, the composite$_{hot}$ temperature 406 may be reported as 58° C. Notably, the composite temperature determination is dictated by the DRAM 404 in this example because the DRAM 404 has the least amount of headroom (93° C.-68° C.=25° C.) before shutdown (the ASIC 402 has 118° C.-77° C.=41° C. before shutdown).

The function of the composite$_{hot}$ temperature formulation (e.g., equation (2) above) is to identify the component that will reach its maximum operating temperature the earliest and the corresponding thermal shutdown temperature. In effect, the formula focuses on whichever component has the least amount of remaining thermal headroom (temperature headroom) prior to shutdown based on multiple component input temperatures (e.g., ASIC temperature and DRAM temperature), wherein each component has its own offset (e.g., ASIC offset and DRAM offset) to compensate for the component's unique maximum operating limits.

The composite$_{hot}$ temperature formulation caters to protecting device components at hot temperatures as a desire to prevent component damage due to overheating is typical. However, the formulation does not account for cold component temperatures. Notably, cold temperatures are also troublesome as SSD components may fall out of safe operating conditions when a temperature falls below a certain threshold (e.g., 0° C.). As such, the composite$_{hot}$ temperature formulation may be inaccurate and/or fail to provide an adequate warning for preventing damage at colder temperatures, particularly at temperatures below 0° C.

At cold temperatures, the use of the composite$_{hot}$ temperature formulation may need an SSD ambient temperature that is -15° C. or more below the composite$_{hot}$ temperature (e.g., when the test system sets the ambient temperature below 0° C. to achieve a composite temperature of 0° C. or below). As such, the composite$_{hot}$ temperature has a large mismatch with the ambient temperature at cold temperatures. The mismatch may be problematic during testing and validation of the SSD. For example, if the SSD is typically tested or cycled down to no lower than 0° C. ambient temperature (i.e., certain SSD components only perform down to 0° C. ambient temperature), then a test requiring a low composite temperature (e.g., 0° C. or below composite temperature) necessitating an ambient temperature below 0° C. (e.g., -15° C. or below ambient temperature) may cause SSD components to operate well below normal operating conditions and be damaged.

In an aspect, the composite temperature may be adjusted (e.g., pulled down) to better indicate cold component temperatures when the SSD is close to lower operating limits (typically 0° C. component temperature). The cold composite adjustment helps equalize the difference between various SSD test requirements, where some tests require a 0° C. ambient temperature and other tests require a 0° C. or below composite temperature (typically necessitating a -15° C. or below ambient temperature), by attempting to make the composite temperature equal to the ambient temperature at cold temperatures, or at least attempt to lessen a typical temperature difference of -15° C. or more between the composite temperature and the ambient temperature.

In an aspect, a composite temperature formulation may consider both a composite$_{hot}$ temperature and a composite$_{cold}$ temperature (e.g., ambient temperature). Accordingly, the composite temperature may be a linear combination of the composite$_{hot}$ temperature and the composite$_{cold}$ temperature that transitions between one temperature or the other depending on the ambient temperature. A transition period where the composite temperature blends between the composite$_{hot}$ temperature and the composite$_{cold}$ temperature may occur between 0° C. or below (e.g., -5° C.) ambient temperature and T$_{cold}$, where T$_{cold}$ is a temperature that is high enough to allow time for a relatively smooth blending but low enough to avoid activating a hot composite adjustment at room temperature. For example, T$_{cold}$ may be equal to 15° C. The composite temperature may be determined based on equation (3) below:

$$\text{Composite temperature}=\alpha(\text{composite}_{hot})+(1-\alpha)(\text{composite}_{cold}). \quad (3)$$

In equation (3), the composite$_{cold}$ temperature is equal to the ambient temperature. Moreover, the composite$_{hot}$ temperature is equal to a highest temperature value amongst all offset throttling temperature thresholds determined for all monitored device components in the SSD. For example, the composite$_{hot}$ temperature may be determined by equation (4) below:

$$\text{Composite}_{hot}=\max[(1st\text{ component throttling threshold}-1st\text{ component offset}),(2nd\text{ component throttling threshold}-2nd\text{ component offset}),(3rd\text{ component throttling threshold}-3rd\text{ component offset}), \ldots]. \quad (4)$$

Furthermore, in equation (3), the value of α varies based on the ambient temperature. For example, if the ambient temperature is greater than T$_{cold}$ (ambient>T$_{cold}$), then α is equal to 1 (α=1). If the ambient temperature is less than or equal to a lower threshold temperature, e.g., 0° C. or below (ambient≤0° C. or below), then α is equal to 0 (α=0). Otherwise, α is equal to the ambient temperature divided by T$_{cold}$ (α=ambient/T$_{cold}$) if the ambient temperature is greater than the lower threshold temperature (e.g., 0° C. or below) and less than or equal to T$_{cold}$ (lower threshold temperature<ambient≤T$_{cold}$). In one aspect, α or 1-α may be referred to as a scaling factor.

Figure 5:
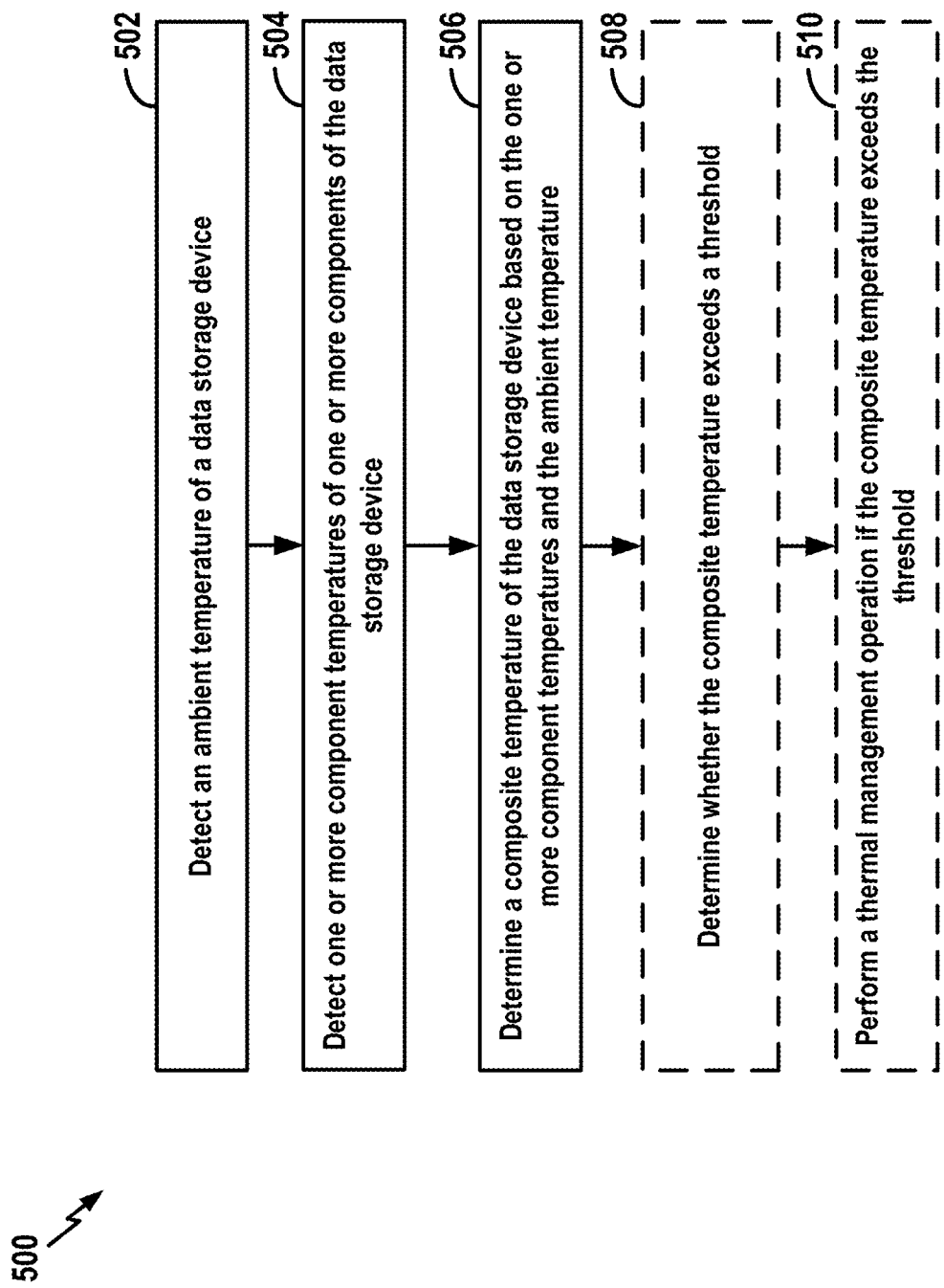
FIG. 5 is a flowchart illustrating a method for thermal management of a data storage device (DSD) or a solid state device (SSD) in accordance with some aspects of the disclosure.

FIG. 5 is a flowchart illustrating a method 500 for thermal management of a data storage device (DSD) or a solid state device (SSD). The method may be performed by a controller of the DSD or SSD in accordance with some aspects of the disclosure. In one aspect, the method/process 500 may be performed by the SSD/DSD controller 108 (or thermal managing arbiter 116) of FIG. 1, or the NVMe controller 618 (or processor 624) of FIG. 6, or any other suitably equipped device controller.

At block 502, the process detects an ambient temperature of the data storage device (e.g., SSD or DSD 104). For example, the ambient temperature may be detected via one or more ambient temperature sensors (e.g., ambient temperature sensor(s) 118 in FIG. 1 or first temperature sensor 302/second temperature sensor 304 in FIG. 3).

At block 504, the process detects one or more component temperatures of one or more components of the data storage device. For example, the one or more component temperatures may be detected via one or more component temperature sensors (e.g., component temperature sensor(s) 120 or third temperature sensor 306/fourth temperature sensor 308 in FIG. 3) positioned at or near a component of the data storage device. Components of the data storage device may include a NAND, a DRAM, a Front End ASIC (FE), a Flash Manager ASIC (FM), or any other type of electronic component housed within the data storage device that produces heat.

At block 506, the process determines a composite temperature of the data storage device based on the one or more component temperatures and the ambient temperature. In an aspect, the process may determine the composite temperature as a function of the ambient temperature scaled by a scaling factor within a preselected temperature range. In another aspect, the process may determine the composite temperature as a function of only the one or more component temperatures outside of the preselected temperature range.

In another aspect, the process may determine the composite temperature by first determining one or more adjusted component temperatures by applying a respective offset to a respective one of the one or more component temperatures. In an aspect, the respective offset applied to a respective component temperature may correspond to an amount of temperature headroom remaining before reaching a shutdown threshold temperature of a component associated with the respective component temperature. The process may then determine a highest adjusted component temperature among the one or more adjusted component temperatures. Thereafter, the process may determine the composite temperature based on the ambient temperature and the highest adjusted component temperature.

In an aspect, the composite temperature is determined based on the equation: Composite temperature=$\alpha$(Composite$_{hot}$)+(1-$\alpha$)(Composite$_{cold}$), wherein Composite$_{hot}$ is the highest adjusted component temperature, Composite$_{cold}$ is the ambient temperature, and $\alpha$ is a value that varies based on a value of the ambient temperature. For example, $\alpha$ is equal to 1 if the ambient temperature is greater than a preselected upper threshold temperature (e.g., $T_{cold}$ or 15° C.), $\alpha$ is equal to 0 if the ambient temperature is less than or equal to a lower threshold temperature (e.g., 0° C. or below), and $\alpha$ is equal to the ambient temperature divided by the preselected upper threshold temperature if the ambient temperature is greater than the lower threshold temperature and less than or equal to the preselected upper threshold temperature.

At optional block 508, the process determines whether the composite temperature exceeds a threshold. For example, the threshold may correspond to an operating temperature limit of the data storage device beyond which one or more components of the data storage device cannot safely operate or risk damage. In some examples, the threshold may correspond to an upper (hot) temperature limit, such as a throttling temperature threshold and/or a shutdown temperature threshold. Additionally or alternatively, the threshold may correspond to a lower (cold) temperature limit, such as 0° C. or below.

At optional block 510, the process performs a thermal management operation if the composite temperature exceeds the threshold. For example, performing the thermal management operation may include indicating a warning composite temperature (WCTEMP) (e.g., to a host device 102), indicating a critical composite temperature (CCTEMP) (e.g., to a host device 102), throttling power of the data storage device, and/or shutting down power of the data storage device. In an aspect, the process also refrains from performing the thermal management operation if the composite temperature does not exceed the threshold.

Figure 6:
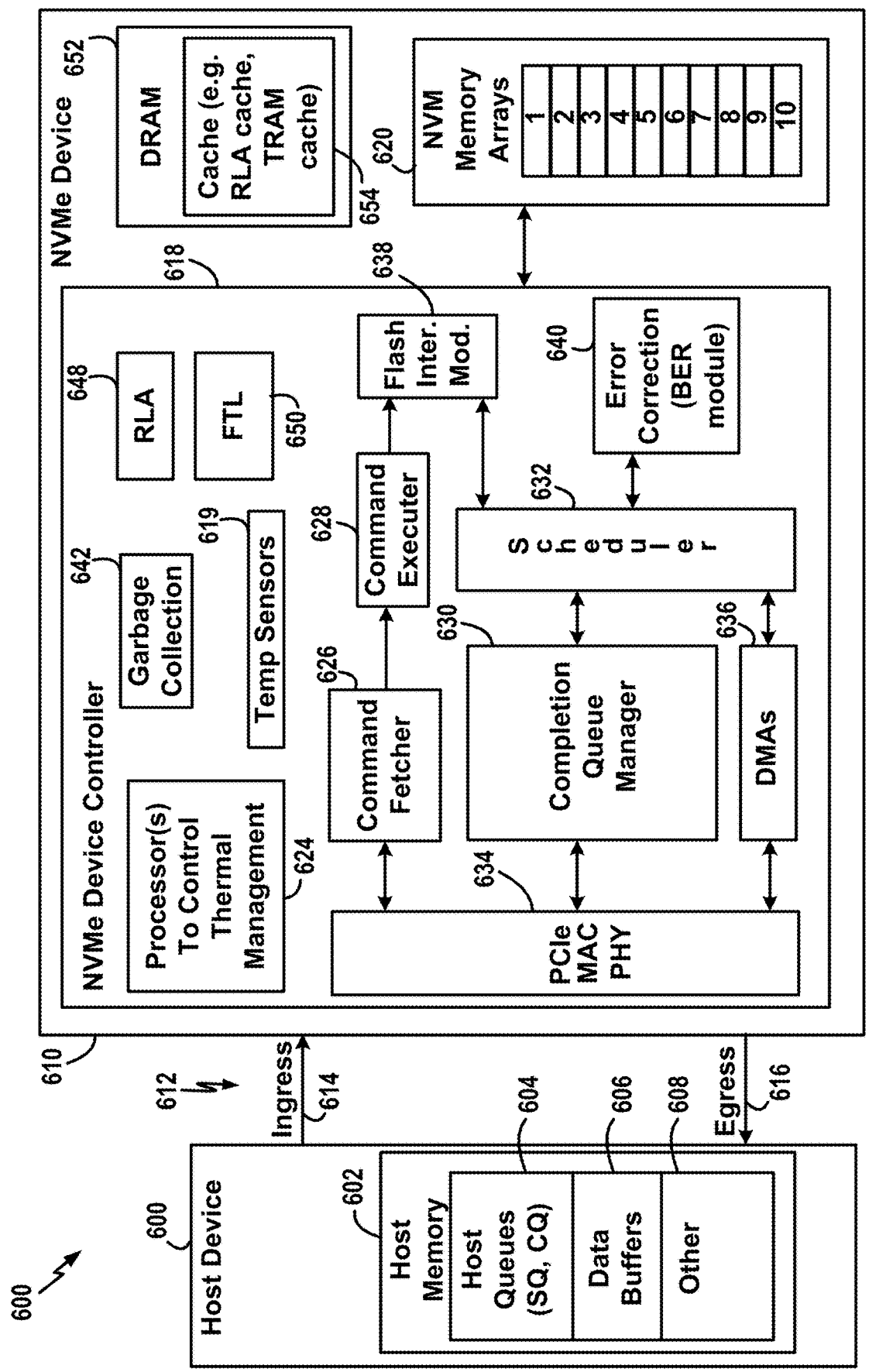
FIG. 6 is a schematic block diagram illustrating an exemplary data storage system with a Non-Volatile Memory express (NVMe) device controller, the controller configured to perform thermal management in accordance with some aspects of the disclosure.

FIG. 6 is a schematic block diagram illustrating an exemplary data storage system with a Non-Volatile Memory express (NVMe) device controller 618, the controller configured to perform thermal management in accordance with some aspects of the disclosure. The system includes a host device 600 that may be any suitable computing or processing platform capable of accessing memory on an NVM data storage device to write data using NVMe procedures. The host device 600 includes internal memory 602, which in this example is dynamic random-access memory (DRAM). The host memory 602 may be configured to include, as shown, various host submission queues (SQs) and completion queues (CQs) 604, data buffers 606 and other memory components 608. The host device 600 may store data in an NVMe storage device 610. The NVMe device 610 may be any suitable device that provides non-volatile memory storage for host device 600 in accordance with NVMe standards. For example, the NVMe device 610 may be a removable storage device, such as a flash SSD that is removably connectable to host device 600. In another example, the NVMe device 610 may be non-removable or integrated within the host device 600. In some embodiments, the host device 600 and the NVMe device 610 are communicatively connected via a PCIe bus 612 (including ingress 614 and egress 616).

The NVMe storage device 610 of FIG. 6 includes an NVMe controller 618 and a non-volatile memory 620. The NVMe controller 618 controls access to the non-volatile memory 620 such as a NAND. The NVMe controller 618 thus may be a non-volatile memory controller that implements or supports the NVMe protocol, and the non-volatile memory 620 may be implemented with two dimensional (2D) or three dimensional (3D) NAND flash memory. The NVMe controller includes one or more processors 624 configured to control/manage thermal throttling, including thermal shutdown and recovery. The processor(s) 624 are also responsible for the execution of other front-end and back-end tasks.

In operation, a command fetcher 626 of the NVMe controller 618 fetches commands, such as read requests for data, from the submission queues within the host memory 602 and forwards the commands to a command executer 628. The command fetcher 626 is responsible for fetching and parsing the commands from the host and queuing them internally, and may form part of a front end of the NVMe controller 618. The command executer 628 is responsible for arbitrating and executing the commands. Upon completion of the commands, the NVMe controller 618 generates completion entries that are ultimately directed to the completion queues within the host memory 602. A completion queue manager 630 is responsible for managing the host completion queues. Among other functions, the completion queue manager 630 routes completion entries received from a scheduler 632 to a completion queue within the host device 600 via a PCIe MAC PHY interface 634.

Actual streams of data (obtained as the result of read commands applied to the NVM memory arrays 620) are delivered to the host device 600 using one or more DMAs 636. Additional components of the NVMe controller 618 shown in FIG. 6 include a flash interface module (FIM) 638, which is responsible for controlling and accessing the memory arrays 620, and an error correction code (ECC) component 640, which includes a bit error rate (BER) module.

Additional components of the NVMe controller 618 include: a garbage collection module 642 for controlling garbage collection and related tasks; a read look ahead (RLA) controller 648; and an FTL 650. Note that some of these components may be part of the flash interface module 638 but are shown separately for the sake of completeness and convenience. The NVMe storage device 610 may additionally include a DRAM 652 (or other working memory), which may include a cache 654.

In one aspect, the thermal management processor 624 can perform one or more of the actions of process 500 in FIG. 5, or act as the thermal managing arbiter 116 of FIG. 1. For example, in one aspect, the thermal management processor 624 can determine a composite temperature of the NVMe storage device 610 based on an ambient temperature and one or more component temperatures received from one or more temperature sensors (e.g., ambient temperature sensor(s) and/or component temperature sensor(s)) placed at various locations within the NVMe storage device 610. In one aspect, the thermal management processor 624 can be implemented as a single processor. In another aspect, the thermal management processor 624 can be implemented with a main processor and a secondary processor (e.g., a physical storage or PS processor). The main processor can be directed to performing the general functions of the controller 618, while the PS processor can be directed to performing the functions (e.g., reads and writes) related to communication with the memory arrays 620.

In one aspect, NAND memory arrays 620 can include a temperature sensor disposed to measure an ambient temperature at the NAND arrays 620, or at particular NAND arrays. In one aspect, the temperature sensor can be disposed within the controller 618 (e.g., temperature sensors 619). In one aspect, one temperature sensor can be disposed at the NVM 620 and one can be disposed at, or within, the controller 618.

In one aspect, the host 600 or the NVMe device 610 includes or acts as a resource server that allocates certain units of power for the device. The techniques described herein for saving power can help the device 610 comply with the power allocations set forth by the resource server.

In the following, various general exemplary procedures and systems are described.

Additional Exemplary Apparatus

Figure 7:
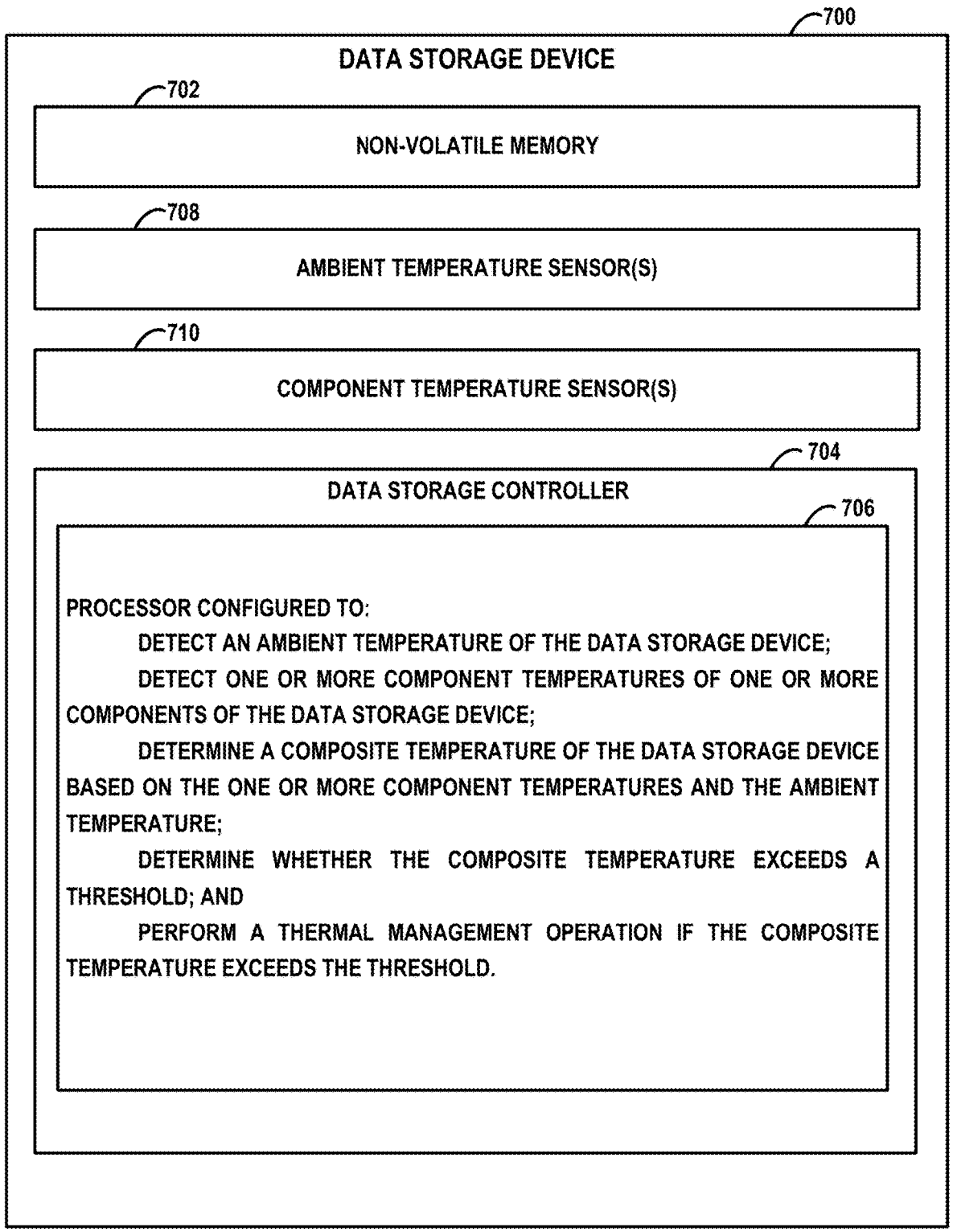
FIG. 7 is a schematic block diagram illustrating an exemplary data storage device configured in accordance with some aspects of the disclosure.

FIG. 7 broadly illustrates a data storage device 700 configured according to one or more aspects of the disclosure. The data storage device 700 includes a non-volatile memory (NVM) 702, one or more ambient temperature sensors 708, one or more component temperature sensors 710, and a data storage controller 704. The data storage controller 704 includes a processor or processing circuit 706 configured to: detect an ambient temperature of the data storage device 700 (via the one or more ambient temperature sensors 708); detect one or more component temperatures of one or more components of the data storage device (via the one or more component temperature sensors 710); determine a composite temperature of the data storage device 700 based on the one or more component temperatures and the ambient temperature; determine whether the composite temperature exceeds a threshold; and perform a thermal management operation if the composite temperature exceeds the threshold.

In one aspect, to perform the thermal management operation, the processor 706 may also be configured to indicate a warning composite temperature (WCTEMP), indicate a critical composite temperature (CCTEMP), throttle power of the data storage device 700, and/or shutdown power of the data storage device 700.

In one aspect, to determine the composite temperature, the processor 706 may also be configured to receive the ambient temperature from the one or more ambient temperature sensors 708, receive the one or more component temperatures from the one or more component temperature sensors 710; determine one or more adjusted component temperatures by applying a respective offset to a respective one of the one or more component temperatures, determine a highest adjusted component temperature among the one or more adjusted component temperatures, and determine the composite temperature based on the ambient temperature and the highest adjusted component temperature. In one aspect, the respective offset applied to a respective component temperature corresponds to an amount of temperature headroom remaining before reaching a shutdown threshold temperature of a component associated with the respective component temperature.

In one aspect, the processor 706 determines the composite temperature based on an equation: Composite temperature=$\alpha$(Composite$_{hot}$)+(1−$\alpha$)(Composite$_{cold}$), wherein Composite$_{hot}$ is the highest adjusted component temperature, Composite$_{cold}$ is the ambient temperature, and $\alpha$ is a value that varies based on a value of the ambient temperature. In one aspect, $\alpha$ is equal to 1 if the ambient temperature is greater than a preselected upper threshold temperature (e.g., T$_{cold}$ or 15° C.), $\alpha$ is equal to 0 if the ambient temperature is less than or equal to a lower threshold temperature (e.g., 0° C. or below), and $\alpha$ is equal to the ambient temperature divided by the preselected upper threshold temperature if the ambient temperature is greater than the lower threshold temperature and less than or equal to the preselected upper threshold temperature.

Figure 8:
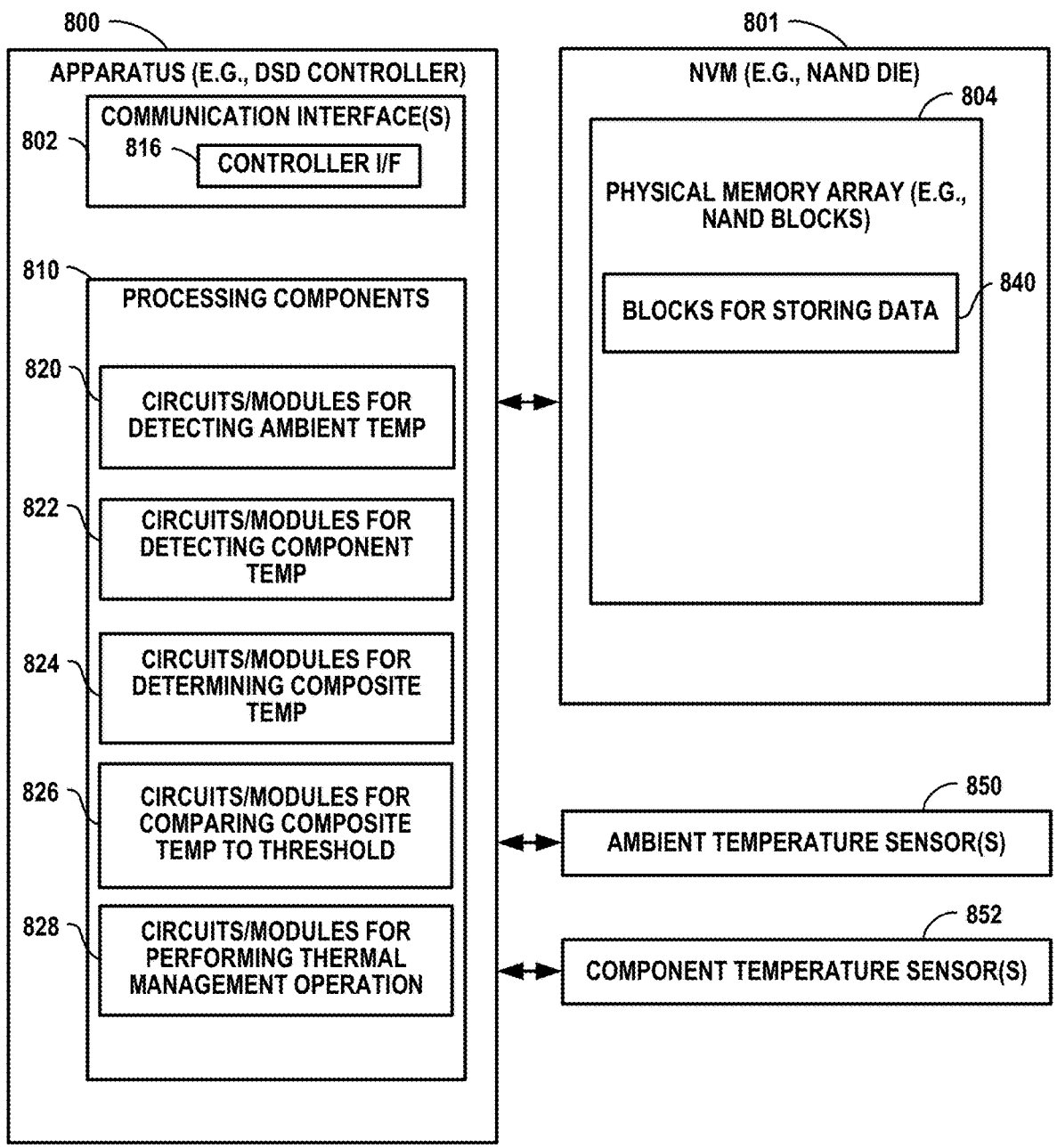
FIG. 8 is a schematic block diagram configuration for an exemplary data storage device configured in accordance with some aspects of the disclosure.

FIG. 8 illustrates an embodiment of an exemplary data storage device 800 configured according to one or more aspects of the disclosure. The apparatus 800, or components thereof, could embody or be implemented within a data storage controller such as a DSD controller coupled to a volatile memory (not shown), one or more ambient temperature sensors 850, one or more component temperature sensors 852, and a NAND die or some other type of NVM array that supports data storage. In various implementations, the apparatus 800, or components thereof, could be a component of a processor, a controller, a computing device, a personal computer, a portable device, workstation, a server, a personal digital assistant, a digital camera, a digital phone, an entertainment device, a medical device, a self-driving vehicle control device, an edge device, or any other electronic device that stores, processes, or uses data.

The apparatus 800 includes a communication interface 802 and is coupled to a NVM 801 (e.g., a NAND die). The NVM 801 includes physical memory array 804. The communication interface 802 is further coupled to the one or more ambient temperature sensors 850 and the one or more component temperature sensors 852. These components can be coupled to and/or placed in electrical communication with one another via suitable components, represented generally by the connection line in FIG. 8. Although not shown, other circuits such as timing sources, peripherals, voltage regulators, and power management circuits may be provided, which will not be described any further.

The communication interface 802 of the apparatus 800 provides a means for communicating with other apparatuses over a transmission medium. In some implementations, the communication interface 802 includes circuitry and/or programming (e.g., a program) adapted to facilitate the communication of information bi-directionally with respect to one or more devices in a system. In some implementations, the communication interface 802 may be configured for wire-based communication. For example, the communication interface 802 could be a bus interface, a send/receive interface, or some other type of signal interface including circuitry for outputting and/or obtaining signals (e.g., outputting signal from and/or receiving signals into a DSD).

The physical memory array 804 may include one or more NAND blocks 840. The physical memory array 804 may be accessed by the processing components 810.

In one aspect, the apparatus 800 may also include volatile memory for storing instructions and other information to support the operation of the processing components 810.

The apparatus 800 includes various processing components 810 arranged or configured to obtain, process and/or send data, control data access and storage, issue or respond to commands, and control other desired operations. For example, the processing components 810 may be implemented as one or more processors, one or more controllers, and/or other structures configured to perform functions. According to one or more aspects of the disclosure, the processing components 810 may be adapted to perform any or all of the features, processes, functions, operations and/or routines described herein. For example, the processing components 810 may be configured to perform any of the steps, functions, and/or processes described with respect to FIGS. 1-7. As used herein, the term "adapted" in relation to processing components 810 may refer to the components being one or more of configured, employed, implemented, and/or programmed to perform a particular process, function, operation and/or routine according to various features described herein. The circuits may include a specialized processor, such as an ASIC that serves as a means for (e.g., structure for) carrying out any one of the operations described, e.g., in conjunction with FIGS. 1-7. The processing components 810 serve as an example of a means for processing. In various implementations, the processing components 810 may provide and/or incorporate, at least in part, functionality described above for the components of controller 108 of FIG. 1 or controller 618 of FIG. 6.

According to at least one example of the apparatus 800, the processing components 810 may include one or more of: circuit/modules 820 configured for detecting an ambient temperature of the data storage device (e.g., via the one or more ambient temperature sensors 850); circuit/modules 822 configured for detecting one or more component temperatures of one or more components of the data storage device (e.g., via the one or more component temperature sensors 852); circuits/modules 824 configured for determining a composite temperature of the data storage device based on the one or more component temperatures and the ambient temperature; circuits/modules 826 configured for determining whether the composite temperature exceeds a threshold; and circuits/modules 828 configured for performing a thermal management operation if the composite temperature exceeds the threshold.

The physical memory array 804 may include blocks 840 for storing data.

In at least some examples, means may be provided for performing the functions illustrated in FIG. 8 and/or other functions illustrated or described herein. For example, the means may include one or more of: means, such as circuits/modules 820, for detecting an ambient temperature of the data storage device 800, means, such as circuits/modules 822, for detecting one or more component temperatures of one or more components of the data storage device 800; and means, such as circuits/modules 824, for determining a composite temperature of the data storage device based on the one or more component temperatures and the ambient temperature.

In at least some other examples, means may be provided for performing the functions illustrated in FIG. 8 and/or other functions illustrated or described herein. For example, the means may include one or more of: means, such as circuits/modules 826, for determining whether the composite temperature exceeds a threshold; and means, such as circuits/modules 828, for performing a thermal management operation if the composite temperature exceeds the threshold.

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NVM, including NAND flash memory such as 3D NAND flash memory. More generally, semiconductor memory devices include working memory devices, such as DRAM or SRAM devices, NVM devices, ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two-dimensional memory structure or a three-dimensional memory structure.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two-dimensional and three-dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state, or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage, or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," "in one aspect," or similar language means that a particular feature, structure, or characteristic described in connection with the embodiment is included in at least one embodiment of the present disclosure. Thus, appearances of the phrases "in one embodiment," "in an embodiment," "in one aspect," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" or "one or more of A, B, or C" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" or "one or more of A, B, or C" is intended to cover A, B, C, A-B, A-C, B-C, and A-B-C, as well as multiples of the same members (e.g., any lists that include AA, BB, or CC). Likewise, "at least one of: A, B, and C" or "one or more of A, B, or C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage device, comprising:
   a non-volatile memory (NVM);
   at least one ambient temperature sensor configured to detect an ambient temperature of the data storage device;
   at least one component temperature sensor configured to detect one or more component temperatures of one or more components of the data storage device; and
   a processor coupled to the NVM, the at least one ambient temperature sensor, and the at least one component temperature sensor, the processor configured to:
     determine a composite temperature of the data storage device based on the one or more component temperatures and the ambient temperature, wherein the processor is further configured to determine the composite temperature as a function of the ambient temperature scaled by a scaling factor responsive to the ambient temperature being within a preselected temperature range,
     determine whether the composite temperature exceeds a threshold, and
     perform a thermal management operation responsive to the composite temperature exceeding the threshold.

2. The data storage device of claim 1, wherein the processor is further configured to:
   refrain from performing the thermal management operation responsive to the composite temperature not exceeding the threshold.

3. The data storage device of claim 1, wherein the processor configured to determine the composite temperature is further configured to:
   determine the composite temperature as a function of only the one or more component temperatures responsive to the ambient temperature exceeding a highest temperature of the preselected temperature range.

4. The data storage device of claim 1, wherein the processor configured to perform the thermal management operation is further configured to perform at least one of:
   indicate a warning composite temperature;
   indicate a critical composite temperature;
   throttle power of the data storage device; or
   shutdown power of the data storage device.

5. The data storage device of claim 1, wherein the processor configured to determine the composite temperature is further configured to:
   receive the ambient temperature from the at least one ambient temperature sensor;
   receive the one or more component temperatures from the at least one component temperature sensor;
   determine one or more adjusted component temperatures by applying a respective offset to a respective one of the one or more component temperatures;
   determine a highest adjusted component temperature among the one or more adjusted component temperatures; and
   determine the composite temperature based on the ambient temperature and the highest adjusted component temperature.

6. The data storage device of claim 5, wherein the respective offset applied to a respective component temperature corresponds to an amount of temperature headroom remaining before reaching a shutdown threshold temperature of a component associated with the respective component temperature.

7. The data storage device of claim 5, wherein the processor is further configured to determine the composite temperature based on an equation:

$$\text{Composite temperature} = \alpha(\text{Composite}_{hot}) + (1-\alpha)(\text{Composite}_{cold}),$$

wherein $\text{Composite}_{hot}$ is the highest adjusted component temperature, $\text{Composite}_{cold}$ is the ambient temperature, and $\alpha$ is a value that varies based on a value of the ambient temperature.

8. The data storage device of claim 7, wherein:
   $\alpha$ is equal to 1 if the ambient temperature is greater than a preselected upper threshold temperature;
   $\alpha$ is equal to 0 if the ambient temperature is less than or equal to a lower threshold temperature; and
   $\alpha$ is equal to the ambient temperature divided by the preselected upper threshold temperature if the ambient temperature is greater than the lower threshold temperature and less than or equal to the preselected upper threshold temperature.

9. The data storage device of claim 8, wherein the lower threshold temperature is 0° C., and wherein the preselected upper threshold temperature is 15° C.

10. A method for use with a data storage device including a non-volatile memory (NVM), the method comprising:
    detecting an ambient temperature of the data storage device;
    detecting one or more component temperatures of one or more components of the data storage device;
    determining a composite temperature of the data storage device based on the one or more component temperatures and the ambient temperature, wherein the composite temperature is determined as a function of the ambient temperature scaled by a scaling factor when the ambient temperature is within a preselected temperature range;
    determining whether the composite temperature exceeds a threshold; and
    performing a thermal management operation responsive to the composite temperature exceeding the threshold.

11. The method of claim 10, further comprising:
    refraining from performing the thermal management operation responsive to the composite temperature not exceeding the threshold.

12. The method of claim 10, wherein determining the composite temperature comprises:
    determining the composite temperature as a function of only the one or more component temperatures responsive to the ambient temperature exceeding a highest temperature of the preselected temperature range.

13. The method of claim 10, wherein performing the thermal management operation comprises at least one of:
    indicating a warning composite temperature;
    indicating a critical composite temperature;
    throttling power of the data storage device; or
    shutting down power of the data storage device.

14. The method of claim 10, wherein determining the composite temperature comprises:
    determining one or more adjusted component temperatures by applying a respective offset to a respective one of the one or more component temperatures;
    determining a highest adjusted component temperature among the one or more adjusted component temperatures; and
    determining the composite temperature based on the ambient temperature and the highest adjusted component temperature.

15. The method of claim 14, wherein the respective offset applied to a respective component temperature corresponds to an amount of temperature headroom remaining before reaching a shutdown threshold temperature of a component associated with the respective component temperature.

16. The method of claim 14, wherein the composite temperature is determined based on an equation:

$$\text{Composite temperature} = \alpha(\text{Composite}_{hot}) + (1-\alpha)(\text{Composite}_{cold}),$$

wherein $\text{Composite}_{hot}$ is the highest adjusted component temperature, $\text{Composite}_{cold}$ is the ambient temperature, and $\alpha$ is a value that varies based on a value of the ambient temperature.

17. The method of claim 16, wherein:
    $\alpha$ is equal to 1 if the ambient temperature is greater than a preselected upper threshold temperature;
    $\alpha$ is equal to 0 if the ambient temperature is less than or equal to a lower threshold temperature; and
    $\alpha$ is equal to the ambient temperature divided by the preselected upper threshold temperature if the ambient temperature is greater than the lower threshold temperature and less than or equal to the preselected upper threshold temperature.

18. The method of claim 17, wherein the lower threshold temperature is 0° C., and wherein the preselected upper threshold temperature is 15° C.

19. A data storage device, comprising:
    a non-volatile memory (NVM);
    means for detecting an ambient temperature of the data storage device;
    means for detecting one or more component temperatures of one or more components of the data storage device;
    means for determining a composite temperature of the data storage device based on the one or more component temperatures and the ambient temperature, wherein the composite temperature is determined as a function of the ambient temperature scaled by a scaling factor when the ambient temperature is within a preselected temperature range;
    means for determining whether the composite temperature exceeds a threshold; and
    means for performing a thermal management operation if the composite temperature exceeds the threshold.

20. The data storage device of claim 1, wherein the scaling factor is a value greater than 0 and less than 1.

21. The method of claim 10, wherein the scaling factor is a value greater than 0 and less than 1.

* * * * *